(12) United States Patent
Lobsiger et al.

(10) Patent No.: US 9,007,102 B2
(45) Date of Patent: Apr. 14, 2015

(54) ACTIVE GATE DRIVE CIRCUIT (71) Applicant: ABB Research Ltd, Zürich (CH)

(72) Inventors: Yanick Lobsiger, Aarau (CH); Johann Kolar, Zürich (CH); Matti Laitinen, Kirkkonummi (FI)

(73) Assignee: ABB Research Ltd., Zurich (CH)

( * ) Notice: Subject to any disclaimer, the term of this patent is extended or adjusted under 35 U.S.C. 154(b) by 0 days.

(21) Appl. No.: 14/309,171

(22) Filed: Jun. 19, 2014

(65) Prior Publication Data
US 2014/0375362 A1 Dec. 25, 2014

(30) Foreign Application Priority Data

Jun. 20, 2013 (EP) ..................................... 13172938

(51) Int. Cl.
*H03K 17/06* (2006.01)
*H03K 17/00* (2006.01)
(52) U.S. Cl.
CPC ....................................... *H03K 17/00* (2013.01)
(58) Field of Classification Search
None
See application file for complete search history.

(56) References Cited

U.S. PATENT DOCUMENTS

| | | | | | |
|---|---|---|---|---|---|
| 3,764,885 | A | * | 10/1973 | Buxbaum et al. | ................ 363/54 |
| 5,609,136 | A | * | 3/1997 | Tuken | ............................ 123/357 |
| 2003/0196616 | A1 | * | 10/2003 | Simpson | .................... 123/90.15 |
| 2004/0085117 | A1 | | 5/2004 | Melbert et al. | |
| 2005/0254265 | A1 | * | 11/2005 | Yamada | ........................... 363/13 |
| 2006/0112701 | A1 | * | 6/2006 | Dykstra | ............................ 62/132 |
| 2009/0308603 | A1 | * | 12/2009 | Borgstadt | ................. 166/250.15 |
| 2010/0017093 | A1 | * | 1/2010 | Mahmood | ....................... 701/100 |
| 2013/0181750 | A1 | * | 7/2013 | Lobsiger et al. | ............... 327/109 |
| 2014/0293669 | A1 | * | 10/2014 | Fornage | .......................... 363/95 |

FOREIGN PATENT DOCUMENTS

WO     WO 02/47265 A2     6/2002

OTHER PUBLICATIONS

Search Report dated Nov. 15, 2013, by the European Patent Office for Application No. 13172938.
Grbovic, "An IGBT Gate Driver for Feed-Forward Control of Turn-on Losses and Reverse Recovery Current," IEEE Transactions on Power Electronics, Mar. 2008, pp. 643-652, vol. 23, No. 2.

(Continued)

*Primary Examiner* — Lincoln Donovan
*Assistant Examiner* — Khareem E Almo
(74) *Attorney, Agent, or Firm* — Buchanan Ingersoll & Rooney PC (57) ABSTRACT

An exemplary gate drive circuit and method are disclosed for controlling a gate-controlled component, the gate drive circuit having a PI controller adapted to receive an input reference signal and to control a gate voltage of the gate-controlled component. The gate drive circuit can include a first feedback loop for the PI controller, the first feedback loop having a first gain ($k_v$), a second feedback loop for the PI controller, the second feedback loop having a second gain ($k_i$), and a clipping circuit adapted to modify a feedback signal in the second feedback loop during turn-on of the gate-controlled component when the time derivative of the collector current is negative. The first feedback loop can include a first blanking circuit adapted to cut the feedback loop when the gate-controlled component is in a blocking state.

20 Claims, 7 Drawing Sheets

(56) References Cited

OTHER PUBLICATIONS

Park et al., "Flexible *dv/dt* and *di/dt* Control Method for Insulated Gate Power Switches," IEEE Transactions on Industry Applications, May/Jun. 2003, pp. 657-664, vol. 39, No. 3.

Dörlemann et al., "New IGBT Driver with Independent dv/dt- and di/dt-Feedback Control for Optimized Switching Behavior", Proc. of the 2nd Int. Conf. on Integrated Power Electronic Systems (CIPS), 2002 (month unknown), pp. 107-114.

Lobsiger et al., "Closed-Loop IGBT Gate Drive Featuring Highly Dynamic di/dt and dv/dt Control", IEEE, Sep. 2012, pp. 4754-4761.

Lobsiger et al., "Stability and Robustness Analysis of d/dt-Closed-Loop IGBT Gate Drive", Applied Power Electronics Conference and Exposition (APEC), IEEE, Mar. 2013, pp. 2682-2689.

* cited by examiner

Figure 12

ACTIVE GATE DRIVE CIRCUIT

RELATED APPLICATION

This application claims priority under 35 U.S.C. §119 to European Patent Application No. 13172938.6 filed in Europe on Jun. 20, 2013, the entire content of which is hereby incorporated by reference in its entirety.

FIELD

The present disclosure relates to gate drivers, such as gate drivers employing closed-loop control of current and voltage slope.

BACKGROUND INFORMATION

Insulated gate bipolar transistor (IGBT) modules are widely used in inductive (hard) switching voltage source power electronic converters such as drives, switched-mode power supplies or solid state transformers.

The desire for minimizing switching losses of the IGBT, sticking the current and voltage conditions to the save operating area (SOA), (e.g. limiting the turn-off overvoltage and the peak reverse recovery current during turn-on), and restricting electromagnetic interference (EMI) is a challenging task of the IGBT's gate drive. Setting a collector current slope $di_C/dt$ at turn-on allows the peak reverse recovery current to be limited, and $di_C/dt$ during turn-off defines the overvoltage resulting from the voltage drop across the total commutation loop inductance $L_\sigma$. To provide electromagnetic compatibility (EMC), as the case may be, the collector-emitter voltage slope $dv_{CE}/dt$ and $di_C/dt$ has to be restricted to specified values.

An independent current and voltage slope control individually for turn-on and turn-off allows the gate drive to optimally switch the IGBT in all operating points with minimal switching losses while sticking to the SOA and providing EMC. In addition, if IGBT modules are directly connected in series or in parallel, the control of $dv_{CE}/dt$ or $di_C/dt$ enables a symmetrical voltage or current sharing.

A simple and common way of adjusting the switching speed of IGBTs is to insert additional passive components into the circuit. An additional gate resistance $R_G$ reduces the gate current and therefore also both current and voltage slopes, an extra Miller capacitance $C_{GC}$ lowers $dv_{CE}/dt$ and an added gate-emitter capacitance $C_{Ge}$ slows down $di_C/dt$. This approach can lead either to excessive switching losses or to increased delays and gate driving losses due to the larger amount of gate charge needed.

To avoid additional gate driving losses, a feed-forward gate voltage shape generator can be used to adjust the $di_C/dt$. However, in this approach the controllability of the voltage slope is low. See [1] P. J. Grbovic, "An IGBT gate driver for feed-forward control of turn-on losses and reverse recovery current," *IEEE Transactions on Power Electronics*, vol. 23, no. 2, pp. 643-652, March 2008.

Further possibilities to influence the gate current during the switching transients are for example switchable or adjustable gate resistor(s), current sources/sinks or gate voltages. As the implementation of such gate drives with an adjustable output stage has to ensure the operation in the SOA, (e.g., limited $di_C/dt$ and $dv_{CE}/dt$), for all operating conditions (varied $T_j$, $i_{LOAD}$, $v_{DC}$), for most of the operating points the desired optimal current and voltage slopes are not achieved, which results in increased switching losses. In addition, the system state of a semiconductor (e.g., the transition from the current to the voltage transients and vice versa), should be detected most accurately in an additional complex circuit, to be able to independently adjust $di_C/dt$ and $dv_{CE}/dt$.

Missing compensation of the IGBT's non-linearities and dependencies on the operating point is a further and main drawback of all these open-loop control topologies. The IGBT's transconductance $g_m$ in fact varies with the gate voltage $v_{Ge}$ and the junction temperature $T_j$ as well as both capacitance values $C_{Ge}$ and $C_{GC}$ depend on the applied voltage, especially the Miller capacitance. With an open-loop approach, accurately defined and constant current and voltage slopes can therefore not be obtained. For that reason, topologies with feedback are applied to achieve more precise control.

Best performance with regard to analog control bandwidth can be achieved by $di_C/dt$ and $dv_{CE}/dt$ control topologies due to simple and high bandwidth measurement circuits, easy to generate constant reference value(s) and simple control amplifier stages. Different implementations of only $di_C/dt$ control or individual solutions for current or voltage slope control during turn-on or turn-off have been presented. See [2] S. Park and T. M. Jahns, "Flexible dv/dt and di/dt control method for insulated gate power switches," *IEEE Transactions on Industry Applications*, vol. 39, no. 3, pp. 657-664, 2003.

A complete solution of turn-on and turn-off $di_C/dt$ and $dv_{CE}/dt$ control was presented in, for example, see [3] C. Dörlemann and J. Melbert, "New IGBT driver with independent dv/dt- and di/dt-feedback control for optimized switching behavior," *Proc. of the 2nd Int. Conf. on Integrated Power Electronic Systems (CIPS)*, pp. 107-114, 2002. Due to the implementation with a large amount of bipolar transistors and an active detection and selection of the control loop, the performance was limited to 200 A/µs and 1 kV/µs

SUMMARY

A gate drive circuit is disclosed for controlling a gate-controlled component, the gate drive circuit comprising: a PI controller configured to receive an input reference signal ($v_{ref,d/dt}$) and to control a gate voltage of a gate-controlled component; a first feedback loop for the PI controller configured to provide feedback from a time derivative of a collector-to-emitter voltage ($v_{CE}$) of the controlled gate-component, the first feedback loop having first gain ($k_v$), and having a first blanking circuit configured to cut the first feedback loop when the gate-controlled component is in a blocking state; and a second feedback loop for the PI controller configured to provide feedback from a time derivative of a collector current ($i_C$) of the gate-controlled component, the second feedback loop having second gain ($k_i$), and having a clipping circuit configured to modify the feedback signal in the second feedback loop during turn-on of the gate-controlled component when the time derivative of the collector current is negative.

A method for controlling a gate-controlled component is also disclosed by using a PI controller configured to receive an input reference signal ($v_{ref,d/dt}$) and to control a gate voltage of the gate-controlled component, the method comprising: providing the input reference signal ($v_{ref,d/dt}$) to the PI controller; obtaining a first feedback signal for the PI controller in a first feedback loop from a time derivative of a collector-to-emitter voltage ($v_{CE}$) of the gate-controlled component; obtaining a second feedback signal for the PI controller in a second feedback loop from a time derivative of a collector current ($i_C$) of the gate-controlled component; modifying the second feedback signal in a second feedback loop during turn-on of the gate-controlled component when the time derivative of the collector current is negative; and cutting the first feedback signal when the gate-controlled component is in a blocking state.

BRIEF DESCRIPTION OF THE DRAWINGS

In the following, features disclosed herein will be described in greater detail by way of preferred exemplary embodiments with reference to the accompanying drawings, in which.

DETAILED DESCRIPTION

A driving method and driver circuit implementing the method are disclosed for alleviating the above mentioned disadvantages.

Exemplary embodiments can use a single PI controller that controls both $di_C/dt$ and $dv_{CE}/dt$ of the gate-controlled component. Due to the nature of turn-on and turn-off procedures, either the collector current or the collector-to-emitter voltage changes at a time thereby enabling the use of only one PI controller with simultaneously active $di_C/dt$ and $dv_{CE}/dt$ feedback loops.

An active gate drive as disclosed herein can provide highly dynamic control using simple hardware implementation. For the hardware implementation only simple measurement circuits, a constant reference signal during the complete switching operation and one single control amplifier can be used. Due to the natural state transition from $di_C/dt$ to $dv_{CE}/dt$ control and vice versa, no active change of the control loop is needed during the switching transients providing maximum analog control bandwidth.

With an exemplary embodiment, the change rate of the collector current and the change rate of the collector-to-emitter voltage can be controlled using a simple structure. The controlled change rates can ensure that problems relating to high change rates or excessive losses are dealt with.

Figure 1A:
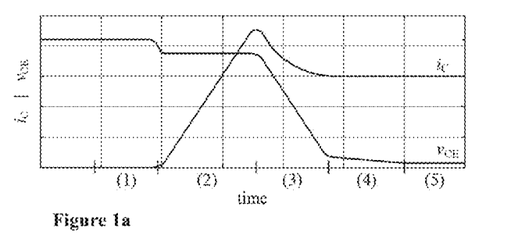
FIGS. 1a and 1b show exemplary schematic current and voltage waveforms of inductive switching transients for a) turn-on and b) turn-off.
Figure 1B:
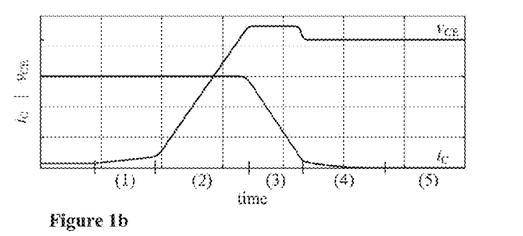

A main characteristic of inductive (hard) switching transients of an IGBT is that sections of current and voltage change follow each other for the turn-on and turn-off operation as depicted in FIG. 1 and described in Table I.

TABLE I

Section description for inductive switching transients according to FIG. 1

| | a) turn-on | b) turn-off |
|---|---|---|
| (1) | turn-on delay ($v_{Ge} < v_{th}$) | charge large $C_{GC}$ |
| (2) | $di_C/dt$ | $dv_{CE}/dt$ |
| (3) | $dv_{CE}/dt$ | $di_C/dt$ |
| (4) | discharge large $C_{GC}$ | tail current |
| (5) | on-state | off-state |

It can be seen in FIG. 1a that collector current increases in section (2) of the turn-on procedure. In the same section the collector emitter voltage stays almost constant.

Due to this temporal separation of the current and voltage slopes, ideally, $dv_{CE}/dt$ is zero during the collector current change and $di_C/dt$ is zero during the collector-emitter voltage change. This fact permits utilization of a combined $di_C/dt$ and $dv_{CE}/dt$ closed-loop control, (e.g., both control loops are active simultaneously), with one single PI controller. In such a case, a natural state transition from the current to the voltage slope control and vice versa occurs due to the hard switching of the IGBT. An exemplary block diagram for this combined current and voltage slope control is depicted in FIG. 2.

Figure 2:
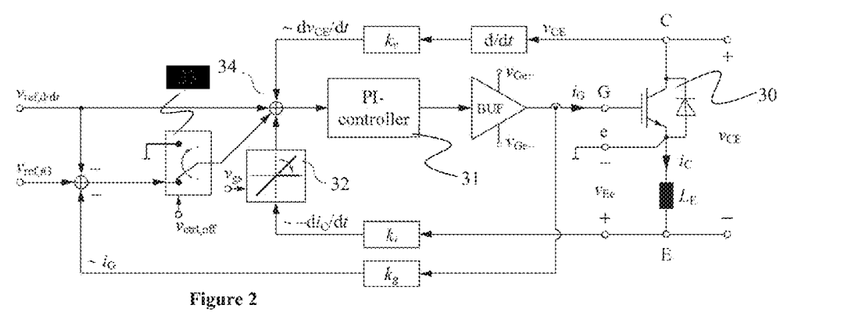
FIG. 2 shows an exemplary block diagram of a combined current and voltage slope control.

FIG. 2 shows a controlled component 30 having a gate G, a collector C and an emitter E. The output of a PI controller 31 is fed to a buffer circuit BUF which amplifies the signal from the PI controller and feeds gate current $i_G$ to the gate of the component. A first feedback loop carries a feedback signal having a value of collector-to-emitter voltage $v_{CE}$ of which a time derivative is taken. This signal is further amplified by gain $k_v$. The signal fed back to the controller is thus proportional to the time derivative of the collector-to-emitter voltage $dv_{CE}/dt$. A second feedback loop can be included which carries a feedback voltage signal which is proportional to the time derivative of the collector current which is obtained as a voltage between the emitter E and an auxiliary emitter e of the component 30 due to a parasitic bonding wire inductance $L_E$.

An input reference signal $v_{ref,d/dt}$, which is set once at the beginning of every switching operation, can be kept at a substantially constant value and can define in combination with feedback gains $k_i$ and $k_v$, set-points for both control variables according to (1) and (2):

$$\frac{di_C}{dt_{ref}} = \frac{v_{ref,d/dt}}{k_i \cdot L_E} \quad (1)$$

$$\frac{dv_{CE}}{dt_{ref}} = \frac{v_{ref,d/dt}}{k_v} \quad (2)$$

With the above equations, it is possible to define the requested voltage and current slopes by setting values of gains.

As the dynamic feedbacks only provide system information during the current and voltage slopes, the PI controller is not able to control the IGBT properly during the turn-on and turn-off delay sections (sections (1) in FIGS. 1a and 1b). There, the controller can increase the gate current too much, resulting in an overshoot of $di_C/dt$ during turn-on and $dv_{CE}/dt$ during turn-off. A solution to control the system state (e.g., the gate current $i_G$) prior to current or voltage slope feedback will be described in the following.

Missing feedback during the delay sections of the switching transients can lead to excessive gate current causing overshoots in $di_C/dt$ at turn-on and $dv_{CE}/dt$ at turn-off. If the gate current is actively controlled in these sections, the overshoots can be prevented. Such a gate current control can be implemented in the active gate drive topology without changing the current and voltage slope control part as depicted in FIG. 2.

The optional gate current control receives measurement from the gate current $i_G$. The third control loop includes gain kg and the feedback signal is subtracted from the reference $v_{ref,iG}$ given for the optional control loop. Similarly, the input reference signal $v_{ref,di/dt}$ is subtracted from the gate current control reference. The obtained error signal is fed to a multiplexer 33 allowing disablement of the gate current control loop. The output of the multiplexer is further connected to the PI controller 31.

To initiate the switching operation, both control loops can be activated simultaneously by setting the reference signals and the multiplexer. Subsequently, the gate current control can be deactivated with the multiplexer not later than in the beginning of the current rise at turn-on or the voltage rise at turn-off. This point in time can, for example, be derived by a specific time after the initiation of the switching operation, reaching a predefined gate-emitter voltage level or the point of active current or voltage slope feedback at the latest. In the example of FIG. 2, the multiplexer 33 is controlled with input $v_{ctrl,off}$.

Figure 3:
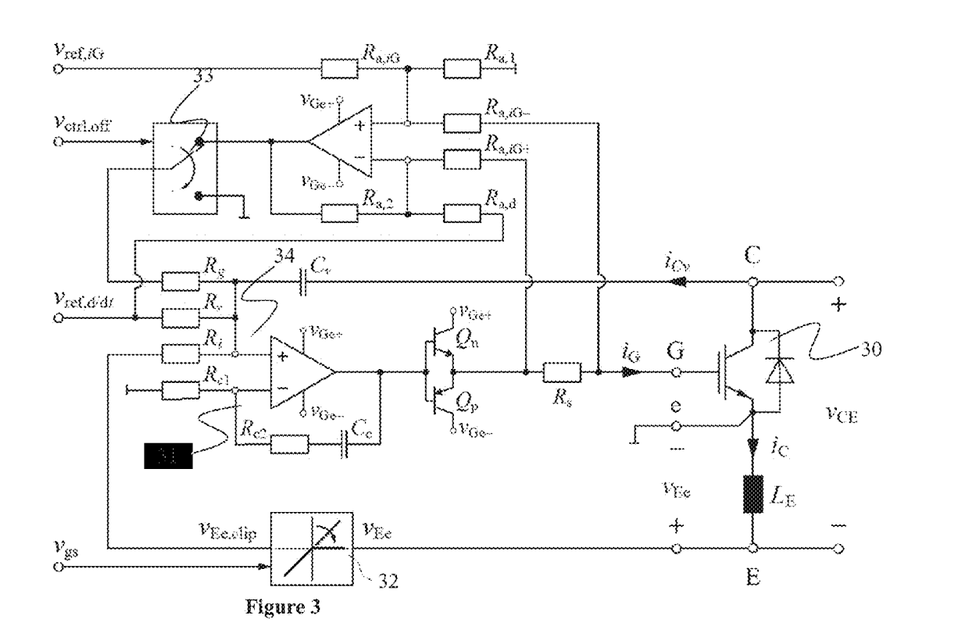
FIG. 3 shows an example of a schematic of an active gate drive.

For an exemplary hardware implementation of the active gate drive, the $di_C/dt$ and $dv_{CE}/dt$ feedback signals are provided, a control error is generated, the PI controller is implemented and a highly dynamic and powerful output buffer is inserted as gate driving output stage. The schematic of the proposed active gate drive is shown in FIG. 3 and will be discussed in the following.

The desired measurements of $di_C/dt$ and $dv_{CE}/dt$ feature a duality. For the current slope measurement, the voltage across an inductance in the current path, (e.g., the emitter's parasitic bonding wire inductance $L_E$), which is proportional to the current time derivative, is used as feedback. For the voltage slope measurement, the current of a capacitor $C_v$ in the voltage path is used as feedback proportional to the voltage time derivative. Neglecting any parasitic inductance and assuming a (+)-input of the operational amplifier that is comparably small with regard to $v_{CE}$, the two feedback signals can be expressed as per (3) and (4):

$$v_{Ee} \approx -L_E \cdot di_C/dt \quad (3)$$

$$i_{Cv} \approx C_v \cdot dv_{CE}/dt \quad (4)$$

For the generation of the control error, (e.g., summing up the reference and feedback signals), a passive network can be deployed as depicted in FIG. 3. Due to the capacitor $C_v$ in the voltage time derivative feedback path, a low-pass characteristic of all remaining signals occurs. This capacitor value can be in the range of several picofarads, so a low-pass time constant in the low nanosecond range results. If this low-pass characteristic, depending on all resistor and capacitor values of the reference signal generation, were to cause a problem, a buffer amplifier could be inserted to decouple the voltage slope feedback.

The PI controller 31 can be implemented with a fast operational amplifier as shown in FIG. 3, where the P- and the I-part result according to (5) and (6):

$$P = 1 + R_{c2}/R_{c1} \quad (5)$$

$$I = 1/(R_{c1}C_c) \quad (6)$$

As the output buffer, a push-pull emitter-follower $Q_n$, $Q_p$ can be used to provide the high analog bandwidth and necessary current gain. In such a case, the parallel connection of lower current rated bipolar transistors as compared with that of single devices is beneficial in terms of current gain (e.g., $h_{FE}>100$) and analog bandwidth (e.g., $f_T>100$ MHz).

FIG. 3 also shows an example of a circuit used for producing the gate current control. Specifically the gate current is measured as a voltage across a resistor $R_s$ which is placed in the gate current path. This voltage signal is fed to an operational amplifier circuit which also receives gate current reference voltage $V_{ref,iG}$. The operational amplifier circuit with resistors $R_{a,iG}$, $R_{a,1}$, $R_{a,iG-}$, $R_{a,iG+}$, $R_{a,d}$ and $R_{a,2}$ produce the functionality of the optional feedback loop of FIG. 2. A summation element 34 of FIG. 2 is formed of resistors $R_g$, $R_r$, $R_i$ and capacitor $C_v$ connected to the operational amplifier of the PI controller 31.

Ideally, the current and voltage transients of the inductive switching are, for example, temporally separated from each other, as illustrated above, enabling a combined $di_C/dt$ and $dv_{CE}/dt$ control. However, during the turn-on voltage slope, the collector current is reduced after the peak reverse recovery current, which leads to undesired additional feedback. This decrease in the collector current is shown in FIG. 1a at the section (3).

Figure 4:
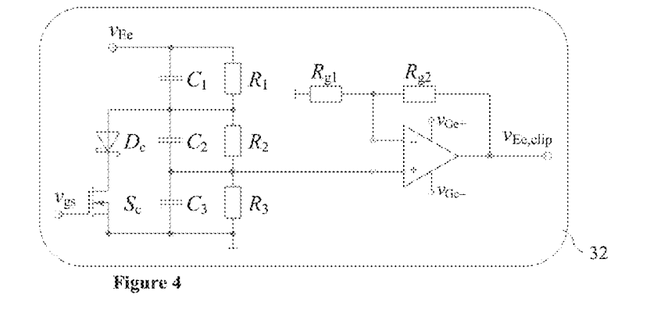
FIG. 4 shows an example of a schematic of a clipping circuit.

For the control topology, a negative $di_C/dt$ feedback during the turn-on voltage slope should be prevented for achieving an optimal control of $dv_{CE}/dt$. This can be achieved by inserting a clipping circuit shown in FIG. 4 into the $di_C/dt$ feedback path as shown in FIG. 3 with reference numeral 32. With the clipping circuit of the embodiment, the negative current slope feedback values are limited to a diode $D_C$ forward voltage scaled down by a compensated voltage divider ($R_2 \| C_2$, $R_3 \| C_3$) when it is enabled. The clipping circuit of the embodiment can be enabled during the turn-on transients only with a switch $S_C$. As control $v_{gs}$ is applied to the gate of the switch $S_c$, positive current occurring during negative current slope feedback can flow through the diode $D_C$ and the voltage of the operational amplifier of FIG. 4 is limited by the forward voltage of the diode and the voltage divider. The operational amplifier together with the resistors $R_{g1}$ and $R_{g2}$ set the gain of the circuit. The voltage of the circuit is outputted as signal $v_{Ee,clip}$ shown also in FIG. 3. As control signal $v_{gs}$ for enabling the clipping circuit, the gate signal input of the gate driver may be directly used, (e.g., the clipping circuit is enabled during the complete turn-on switching transients and disabled during the complete turn-off switching transients).

Double-pulse tests have been performed on an exemplary circuit disclosed herein, and the following measurement results were obtained. The test setup included (e.g., consisted of) a DC link (up to 1 kV, 320 µF), one Infineon FF450R12KE4 IGBT half-bridge module 1.2 kV, 450 A), an air-core pulse inductor (53 µH) and a busbar interconnecting all components.

Figure 5:
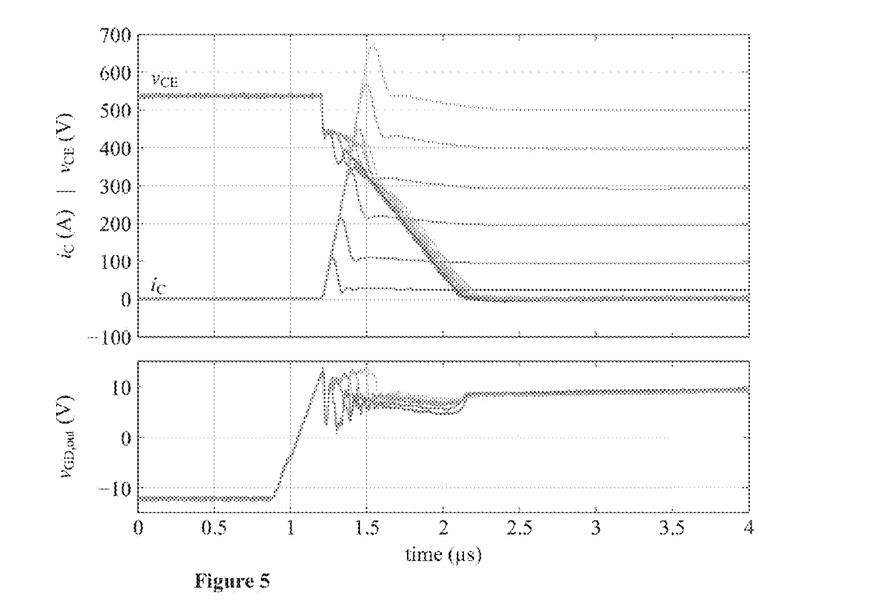
FIG. 5 shows exemplary measured collector current $i_C$, collector-emitter voltage $v_{CE}$ and gate driver output voltage $v_{GD,out}$ during turn-on for varied load currents.

For the reference values of $di_C/dt_{ref}=2$ kA/µs and $dv_{CE}/dt_{ref}=0.5$ kV/µs, the current and voltage transients of the IGBT have been measured for different values of the load current as depicted in FIG. 5. The active gate drive adjusts the output voltage $v_{GD,out}$ to follow the current slope reference until the peak reverse recovery current is taken and then, due to the natural state transition, controls the voltage slope to its reference value. The plots are performed for six different load current values.

Figure 6:
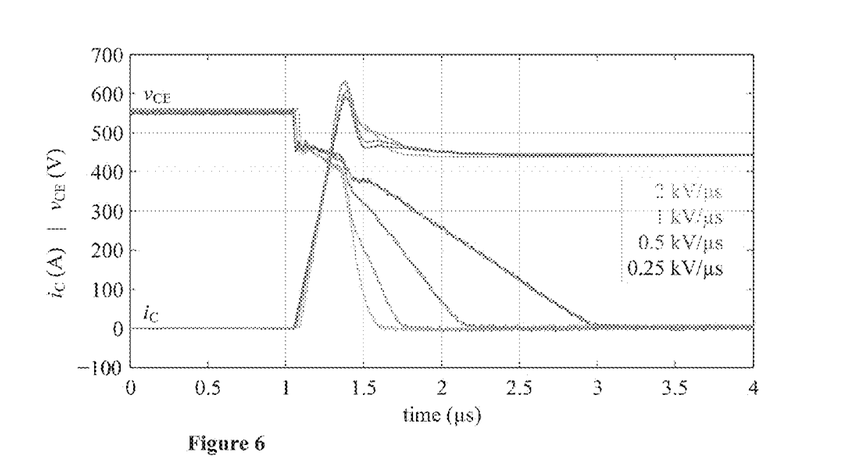
FIG. 6 shows exemplary measured collector current $i_C$ and collector-emitter voltage $v_{CE}$ during turn-on for varied voltage slopes.
Figure 7:
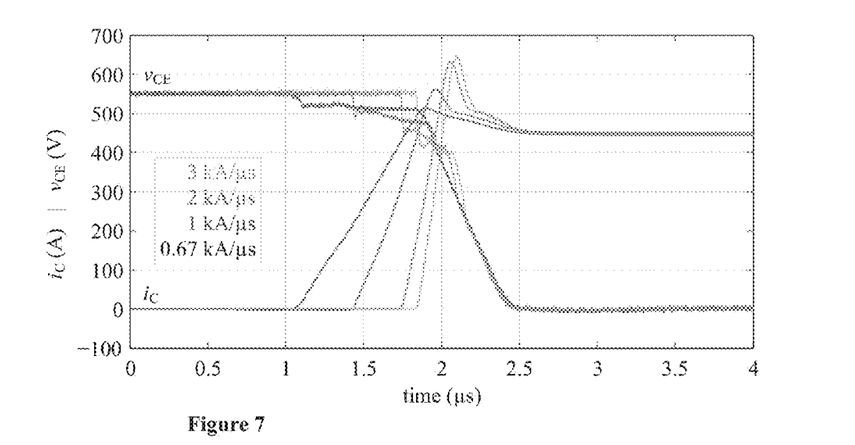
FIG. 7 shows exemplary measured collector current $i_C$ and collector-emitter voltage $v_{CE}$ during turn-on for varied current slopes.

In FIG. 6, the voltage slope reference is varied in the range of $dv_{CE}/dt_{ref}=0.5$ kV/µs . . . 2 kV/µs and in FIG. 7, the current slope reference is varied in the range of $di_C/dt_{ref}=0.67$ kA/µs . . . 3 kA/µs for nominal load current. In both cases, the active gate drive is able to accurately control the current and the voltage slopes to their reference values.

When operating the gate drive circuit of FIGS. 2 and 3 for driving switches in half-bridge configurations with inductive switched current, there are two types of commutations where a certain feedback of the opposite side's (High Side/Low Side) switching might cause an ambiguous operation. The commutations will be described below with reference to FIGS. 8 and 9.

Figure 8:
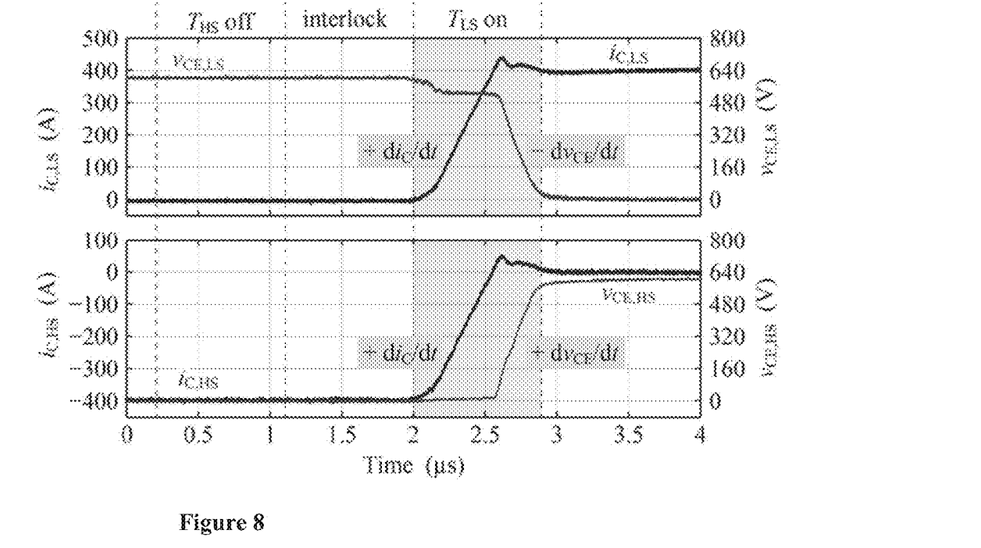
FIGS. 8 and 9 show exemplary current and voltage waveforms in commutation in a half-bridge configuration.

FIG. 8 shows current and voltage waveforms when low side IGBT is turning on with a positive collector current $I_C$. The upper plot of FIG. 8 shows low side (LS) collector current $i_{C,LS}$ and collector-to-emitter voltage $v_{CE,LS}$ waveforms. The lower plot of FIG. 8 shows corresponding waveforms for the high side (HS).

In FIG. 8, first the current commutates from the opposite side (high side) freewheeling diode and then the voltage of the turning on IGBT falls. At the same time, the voltage rises over the opposite side (high side) freewheeling diode and IGBT as shown in FIG. 8. During the current commutation, both low side and high side current feedbacks function as intended, that is limit the current change rate. But for voltage change, the high side feedback is positive, which—depending on the high side turn-off voltage reference ($V_{ref,d/dt}$) and the gain of the dv/dt feedback loop and the time constant of the integrator—might be enough to turn the high side IGBT temporary on again. This would end up in a shoot-through of high side and low side IGBT's. It should be noted that eventually the high side IGBT would turn off as the integrator would force the gate voltage to $V_{ref,d/dt}$.

Figure 9:
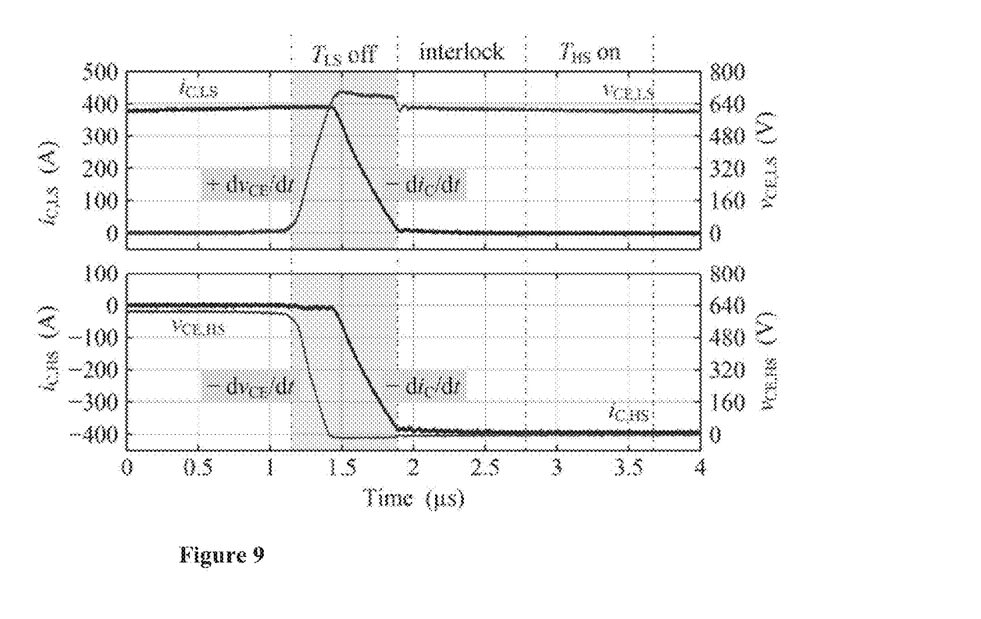

In the commutation shown in FIG. 9, a low side IGBT is turning off with a positive collector current $I_C$. The upper and lower plots of FIG. 9 correspond to those of FIG. 8. First the voltage $v_{CE,LS}$ is charged over the turning off IGBT for the opposite diode to be able to start conducting as seen in FIG. 9. During this time, voltage $v_{CE,HS}$ falls over the high side IGBT and dv/dt feedback keeps the IGBT gate low. This is followed by a current fall conducted by the closed loop di/dt control of the low side IGBT. During this time, the negative di/dt of the high side tends to increase the high side IGBT gate voltage, possibly turning it on. In practice this should not be harmful as the voltage is already over the low side IGBT and the low side IGBT is controlling the current commutation to the high side diode.

As described herein, in the case of a half-bridge configuration, unintended turn-on due to dv/dt and di/dt feedbacks in certain commutations is possible in the circuit of FIGS. 2 and 3. In half-bridge configurations, unintended feedback is possible when the opposite side (high side/low side) is controlling the current. According to an exemplary embodiment, the gate drive circuit can include a first blanking circuit 101 in the first feedback loop and according to an exemplary embodiment, the gate drive circuit can include a second blanking circuit 102 in the second feedback loop.

The blanking circuits allow the operation of the gate driver in half-bridge configurations when an inductive current is switched. The blanking circuits 101, 102 deactivate the di/dt and/or dv/dt feedbacks to a driver circuit as soon as a power semiconductor is in its blocking state. That is to say that the blanking circuits cut the feedbacks to the component once the component is in the blocking state.

Figure 10:
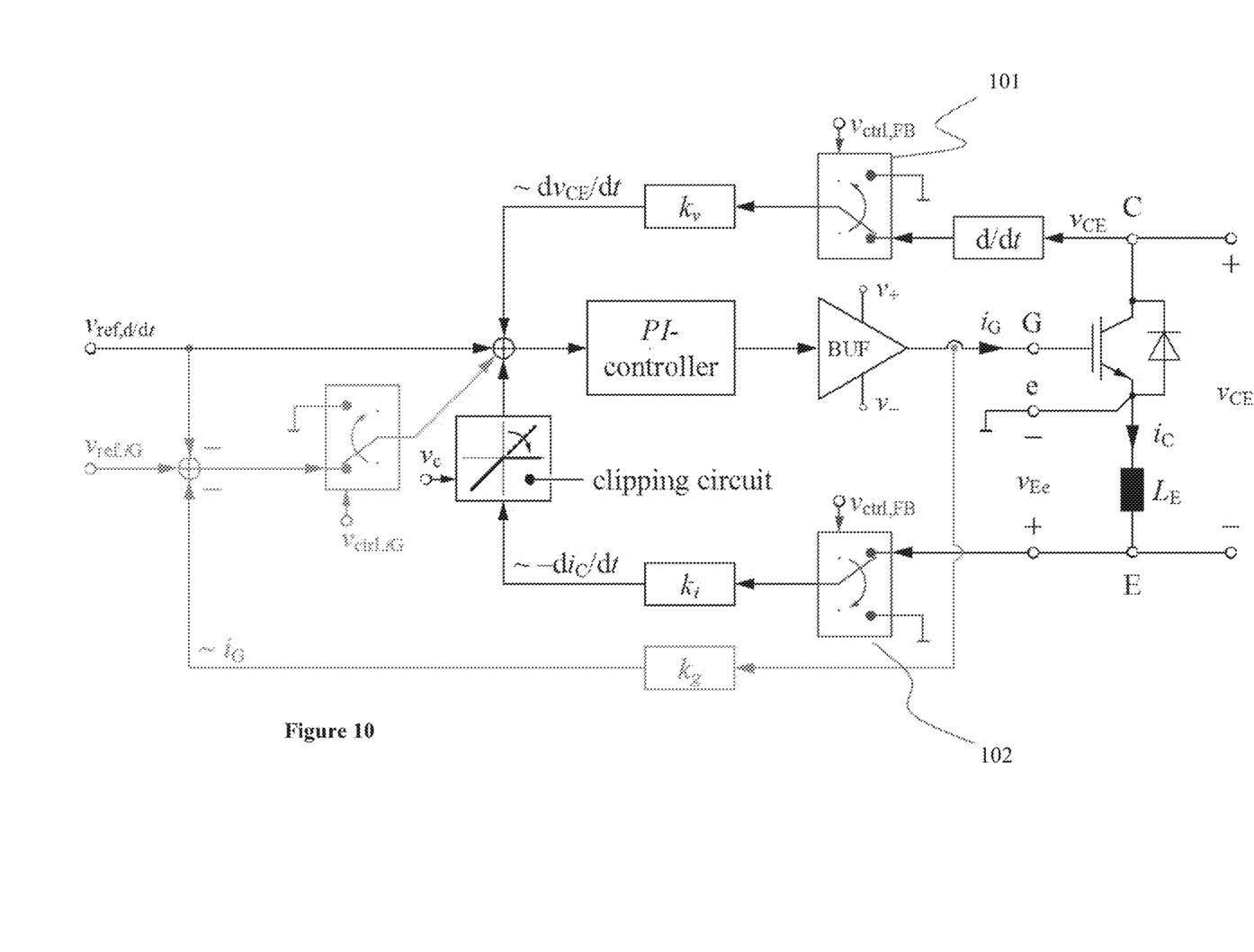
FIGS. 10, 11 and 12 show exemplary embodiments disclosed herein.

The component realizing the blanking can be for example a high-speed multiplexer as shown in FIG. 10. Control signals $V_{ctrl;FB}$ are created based on a status of the IGBT or its gate. It can be generated from the measurable parameters such as collector-to-emitter voltage $v_{CE}$, collector current $i_C$ or from gate-to-emitter voltage $v_{GE}$. The simplest solution would be to test whether or not the gate voltage $v_{GE}$ is below the threshold voltage $V_{ge,th}$.

Adding blanking to the closed loop di/dt and dv/dt gate control ensures that no cross conduction occurs during commutation.

Figure 11:
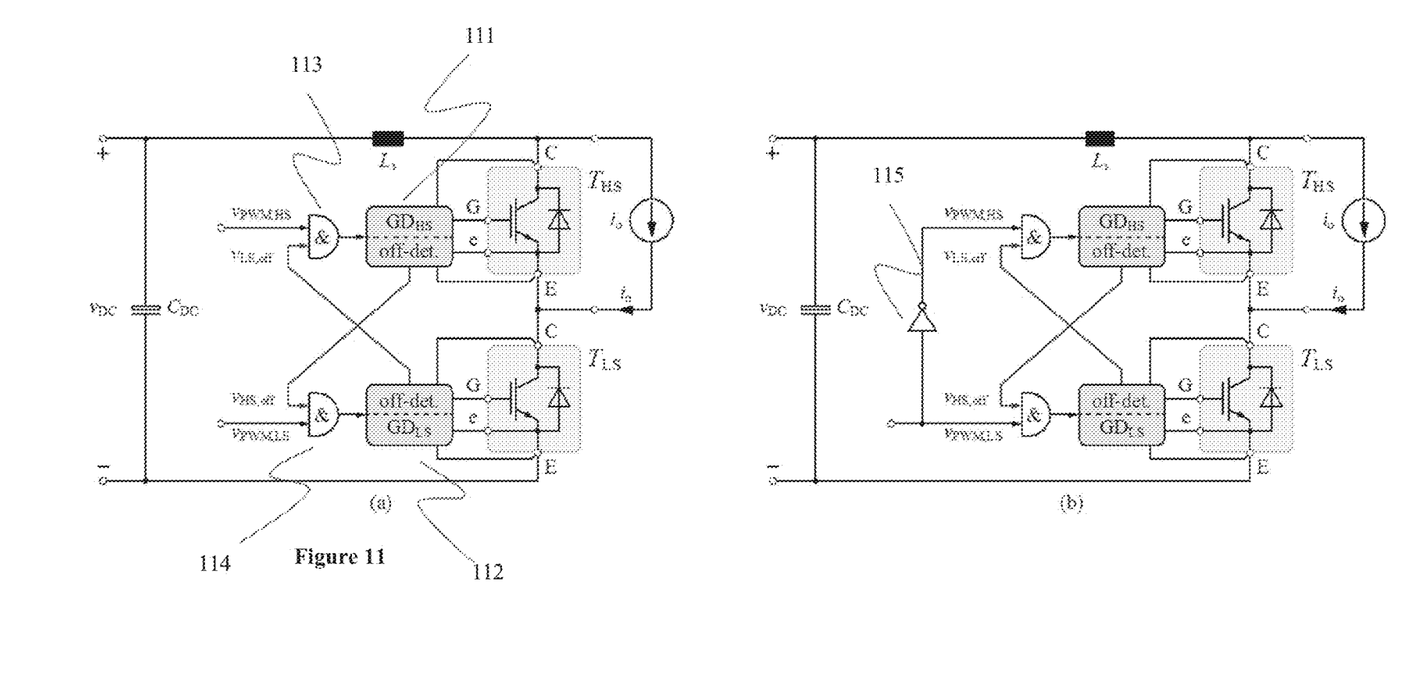

In an exemplary embodiment, the state data used in the blanking circuits of the opposite side (HS/LS) can be further utilized to minimize or even remove a preset commutation delay dead time. FIG. 11 (a) shows an exemplary implementation of such a circuit, where the opposite side off-state detection, that is the above mentioned control signals $V_{ctrl;FB}$ from both high side and low side gate drive circuits, are used for interlocking the high side and low side turn-on and turn-off command, respectively. More specifically, FIG. 11 (a) shows a half-bridge collector-to-emitter connected IGBTs that are driven with the gate drive circuits of the invention. A high side gate driver circuit with off-detection 111 outputs a signal $v_{HS,off}$ indicating the off-state to the low side gate drive circuit through an AND circuit 114. Once the inputted control signal $v_{PWM,LS}$ and the signal indicating the off-state are high, the control is passed through to the gate driver circuit 112. Similarly, the low side off-detection circuit in the gate drive circuit 112 outputs a signal $v_{LS,off}$ to an AND circuit 113 which also receives a high side control signal $v_{PWM,HS}$. When both these signals are high, the control is passed to the gate driver circuit 111. With the aid of the exemplary embodiment, no preset commutation delay necessary for ensuring that one component is in the off-state before the other component is turned on is needed.

As shown in FIG. 11 (b), an exemplary embodiment with state data allows a single control signal per leg to be used. As the high side and the low side switch components are controlled as complementary pairs, the inputted control signal, such as a pulse width modulated signal, is inverted with a logic inverter 115 for one switch component as the other uses the original control signal. The off-detection in the gate drive circuits operates such that the turn-on of the switch component is carried out only after the other switch component has turned off. Other features of FIG. 11 (b) are as in FIG. 11 (a).

In certain exemplary short circuit cases (e.g., at hard switching failure with large short circuit inductance and at failure under load), the collector-to-emitter voltage $v_{CE}$ rises fast while the collector current $i_C$ is rising, too. However, a closed-loop gate drive circuit can be based on the idea that $i_C$ and $v_{CE}$ are not changing simultaneously in order to achieve the desired control. Since this is not true for these aforementioned short circuit cases, there are basically two options to safely turn-off the short circuit, as will be explained.

The short circuit can be turned-off safely by way of the closed-loop gate drive once collector-to-emitter voltage $v_{CE}$ has reached a DC link voltage (e.g., the turn-off is not initiated directly after the detection of the short circuit but when $v_{CE}$ has reached a DC link level). This turn-off solution therefore leads to increased losses in the IGBT due to the artificial turn-off delay and would not work if the short circuit impedance includes (e.g., consists of) a resistive part similar to or higher than that of the IGBT, since in such a case $v_{CE}$ would not reach the DC link voltage.

A simpler and more robust solution without any additional turn-off delay would be to turn-off the short circuit without the closed-loop control but by ways of the implemented gate current control, where a predefined low value of the gate current could be used to safely turn-off the IGBT. For this, the di/dt and dv/dt feedbacks can be deactivated right after the turn-on transients (e.g., once the power semiconductor has reached its on-state), in order for the gate current control to operate without any undesired additional feedback. This can be carried out as described by way of the di/dt and dv/dt blanking circuits 101 and 102 in the feedback paths.

Figure 12:
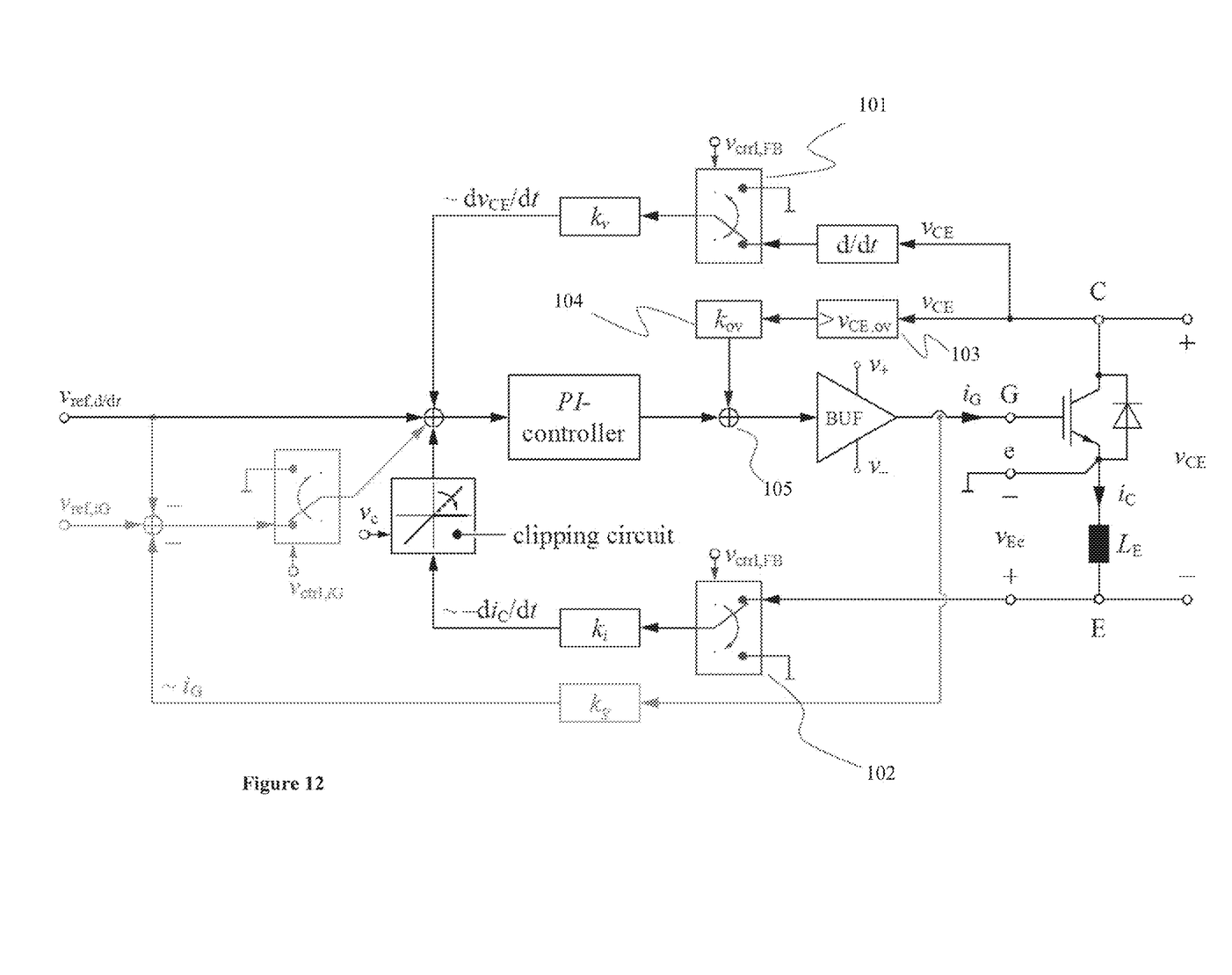

According to an exemplary embodiment, an overvoltage control feedback loop can be added to the gate drive circuit disclosed herein. This feedback is active also while the di/dt is not actively changed, for example during a diode current snap-off, and would protect the IGBT and the freewheeling diode against any overvoltage by turning the IGBT on the basis of a set $v_{CE}$ voltage level similarly to known active clamp circuits. This is depicted in FIG. 12 in which the collector-to-emitter voltage $v_{CE}$ is led to a comparator circuit 103. If the measured voltage exceeds a set limit, the output is amplified with a third gain $k_{ov}$ in a block 104 and further fed to a summation element 105 which adds the output of the block 104 to the output of the PI controller. The obtained sum is fed to the buffer circuit feeding the gate current. The operation of the overvoltage control is such that during collector-to-emitter overvoltage, the gate voltage is increased to interrupt the turn-off procedure of the component so that the di/dt may slow down, resulting in a lower collector-to-emitter voltage.

As is understood, the circuit structures described herein with reference to the drawings are merely examples of possible constructions that are suitable for producing the desired functions disclosed herein. It is clear that certain circuit structures, such as the clipping circuit, may be formed using other structures.

In FIGS. 10 and 11, some additional features are included in the circuit of FIG. 2. As the basic operation principle of the circuits in FIGS. 10 and 11 corresponds to that of FIG. 2, more specific references to various components of FIGS. 10 and 11 are omitted.

The components controlled with the circuits and methods disclosed herein are, for example, IGBT components. Other gate-controlled components include MOSFETs and BJTs and the like.

It will be apparent to a person skilled in the art that as technology advances, the inventive concepts disclosed herein can be implemented in various ways. The invention and its embodiments are not limited to the examples described above but may vary within the scope of the claims.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCES

[1] P. J. Grbovic, "An IGBT gate driver for feed-forward control of turn-on losses and reverse recovery current," *IEEE Transactions on Power Electronics*, vol. 23, no. 2, pp. 643-652, March 2008.

[2] S. Park and T. M. Jahns, "Flexible dv/dt and di/dt control method for insulated gate power switches," *IEEE Transactions on Industry Applications*, vol. 39, no. 3, pp. 657-664, 2003.

[3] C. Dörlemann and J. Melbert, "New IGBT driver with independent dv/dt- and di/dt-feedback control for optimized switching behavior," *Proc. of the 2nd Int. Conf. on Integrated Power Electronic Systems (CIPS)*, pp. 107-114, 2002.

The invention claimed is:

1. A gate drive circuit for controlling a gate-controlled component, the gate drive circuit comprising:
   a PI controller configured to receive an input reference signal ($v_{ref,di/dt}$) and to control a gate voltage of a gate-controlled component;
   a first feedback loop for the PI controller configured to provide feedback from a time derivative of a collector-to-emitter voltage ($v_{CE}$) of the gate-controlled component, the first feedback loop having first gain ($k_v$), and having a first blanking circuit configured to cut the first feedback loop when the gate-controlled component is in a blocking state; and
   a second feedback loop for the PI controller configured to provide feedback from a time derivative of a collector current ($i_C$) of the gate-controlled component, the second feedback loop having second gain ($k_i$), and having a clipping circuit configured to modify the feedback signal in the second feedback loop during turn-on of the gate-controlled component when the time derivative of the collector current is negative.

2. A gate drive circuit according to claim 1, comprising:
   a gate current control loop configured to use the PI controller, which gate current control loop will receive a feedback signal from a gate current and is connectable to control gate current during turn-on and turn-off delays.

3. A gate drive circuit according to claim 1, comprising:
   a buffer circuit (BUF) for amplifying an output signal from the PI controller to drive the gate-controlled component.

4. A gate drive circuit according to claim 1, wherein the clipping circuit comprises:
   a controlled component for enabling the clipping circuit.

5. A gate drive circuit according to claim 1, wherein once enabled, the clipping circuit is configured to limit an output of the gate drive circuit.

6. A gate drive circuit according to claim 1, wherein the time derivative of the collector-to-emitter voltage is determined as a voltage level by a capacitor included in the first feedback loop, the capacitor being responsive to a collector-to-emitter voltage change.

7. A gate drive circuit according to claim 1 wherein the time derivative of the collector current is determined as a voltage level from a voltage over a known inductance.

8. A gate drive circuit according to claim 1, wherein the first feedback loop comprises:
   a second blanking circuit configured to cut the first feedback loop when the controlled component is in the blocking state.

9. A gate drive circuit according to claim 8, wherein the first and/or second blanking circuit(s) is/are configured to receive control ($v_{ctrl,FB}$) for cutting the first feedback loop based on a status of the gate-controlled component or its gate.

10. A gate drive circuit according to claim 9, wherein the control for cutting the feedback loop is based on determining whether the gate voltage of the gate-controlled component is below a threshold voltage ($V_{ge,th}$).

11. A gate drive circuit according to claim 1, comprising:
   a third feedback loop configured to provide feedback from a collector-to-emitter voltage ($v_{CE}$) of the gate-controlled component, the third feedback loop having a third gain ($k_{ov}$), and being configured to be operational to increase the gate voltage when the collector-to-emitter voltage of the gate-controlled component is above a set overvoltage limit value.

12. A gate drive circuit according to claim 9, in a half bridge configuration, wherein the control ($v_{ctrl,FB}$) for cutting the first feedback loop is configured for interlocking low side and high side controls to prevent cross conducting.

13. A gate drive circuit according to claim 1, in a half bridge configuration, wherein in case of over-current, the first blanking circuit is configured to deactivate the first feedback loop or the first and second feedback loops when a power semiconductor is in a state for short circuit turn-off at a set negative gate current.

14. A method for controlling a gate-controlled component by using a PI controller configured to receive an input reference signal ($v_{ref,d/dt}$) and to control a gate voltage of the gate-controlled component, the method comprising:
  providing the input reference signal ($v_{ref,d/t}$) to the PI controller;
  obtaining a first feedback signal for the PI controller in a first feedback loop from a time derivative of a collector-to-emitter voltage ($v_{CE}$) of the gate-controlled component;
  obtaining a second feedback signal for the PI controller in a second feedback loop from a time derivative of a collector current ($i_C$) of the gate-controlled component;
  modifying the second feedback signal in a second feedback loop during turn-on of the gate-controlled component when the time derivative of the collector current is negative; and
  cutting the first feedback signal when the gate-controlled component is in a blocking state.

15. A gate drive circuit according to claim 2, comprising:
  a buffer circuit (BUF) for amplifying an output signal from the PI controller to drive the gate-controlled component.

16. A gate drive circuit according to claim 15, wherein the clipping circuit comprises:
  a controlled component for enabling the clipping circuit.

17. A gate drive circuit according to claim 16, wherein once enabled, the clipping circuit is configured to limit an output of the gate drive circuit.

18. The gate drive circuit according to claim 7, wherein the inductance is a parasitic bonding wire inductance of an emitter.

19. A gate drive circuit according to claim 17, comprising:
  a third feedback loop configured to provide feedback from a collector-to-emitter voltage ($v_{CE}$) of the gate-controlled component, the third feedback loop having a third gain ($k_{ov}$), and being configured to be operational to increase the gate voltage when the collector-to-emitter voltage of the gate-controlled component is above a set overvoltage limit value.

20. A gate drive circuit according to claim 19, in a half bridge configuration, wherein in case of over-current, the first blanking circuit is configured to deactivate the first feedback loop or the first and second feedback loops when a power semiconductor is in a state for short circuit turn-off at a set negative gate current.

* * * * *